United States Patent [19]

Gloton

[11] Patent Number: 4,822,988
[45] Date of Patent: Apr. 18, 1989

[54] CARD CONTAINING A COMPONENT AND A MICROMODULE HAVING SIDE CONTACTS

[75] Inventor: Jean P. Gloton, Aix En Provence, France

[73] Assignee: Eurotechnique, Rousset, France

[21] Appl. No.: 927,182

[22] Filed: Nov. 5, 1986

[30] Foreign Application Priority Data

Nov. 8, 1985 [FR] France ............................. 85 16603

[51] Int. Cl.$^4$ ............................................. G06K 19/00
[52] U.S. Cl. ..................................... 235/492; 361/401; 235/487; 235/380
[58] Field of Search ............... 235/492, 380, 487, 488; 361/401; 357/80; 283/900, 901, 904

[56] References Cited

U.S. PATENT DOCUMENTS

| | | | |
|---|---|---|---|
| 3,702,464 | 11/1972 | Castrucci | 235/492 |
| 3,746,932 | 7/1973 | Hogan et al. | 361/413 |
| 4,442,345 | 4/1984 | Mollier | 235/380 |
| 4,459,607 | 7/1984 | Reid | 357/71 |
| 4,511,796 | 4/1985 | Aigo | 235/492 |
| 4,514,785 | 4/1985 | Parmentier | 361/401 |
| 4,539,472 | 9/1985 | Poetker et al. | 235/488 |

FOREIGN PATENT DOCUMENTS

| | | |
|---|---|---|
| 0095391 | 11/1983 | European Pat. Off. . |
| 0121268 | 1/1984 | European Pat. Off. . |
| 2810054 | 3/1978 | Fed. Rep. of Germany . |
| 2216750 | 4/1973 | France . |
| 2213599 | 8/1974 | France . |
| 2337381 | 12/1975 | France . |
| 2439438 | 10/1978 | France . |
| 2483128 | 5/1981 | France . |
| 2149209 | 8/1981 | United Kingdom . |
| 2073947 | 10/1981 | United Kingdom . |

OTHER PUBLICATIONS

Patents Abstracts of Japan, vol. 8, No. 139 (E253) [1576] June 28, 1984; & JP—A—59—47—478 (Hitachi Seisakusho K.K.).

Primary Examiner—A. D. Pellinen
Assistant Examiner—Leon K. Fuller
Attorney, Agent, or Firm—Oblon, Fisher, Spivak, McClelland & Maier

[57] ABSTRACT

A card having contact pads disposed in rows and spaced in accordance with electronic card standards is provided with a recess for snap-action engagement of a pluggable micromodule having side contacts and containing the core component of the card. The micromodule is connected to the rows of contact pads by means of transfer contacts formed by metallic strips and side contacts within the card recess.

9 Claims, 1 Drawing Sheet

FIG_1
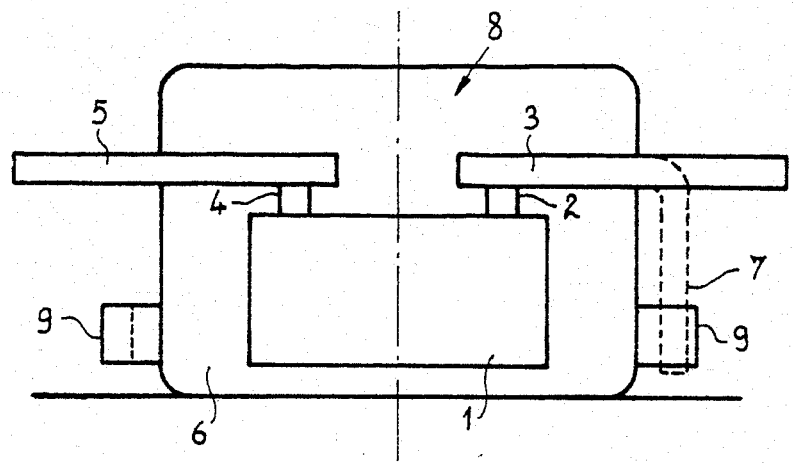
FIG_2
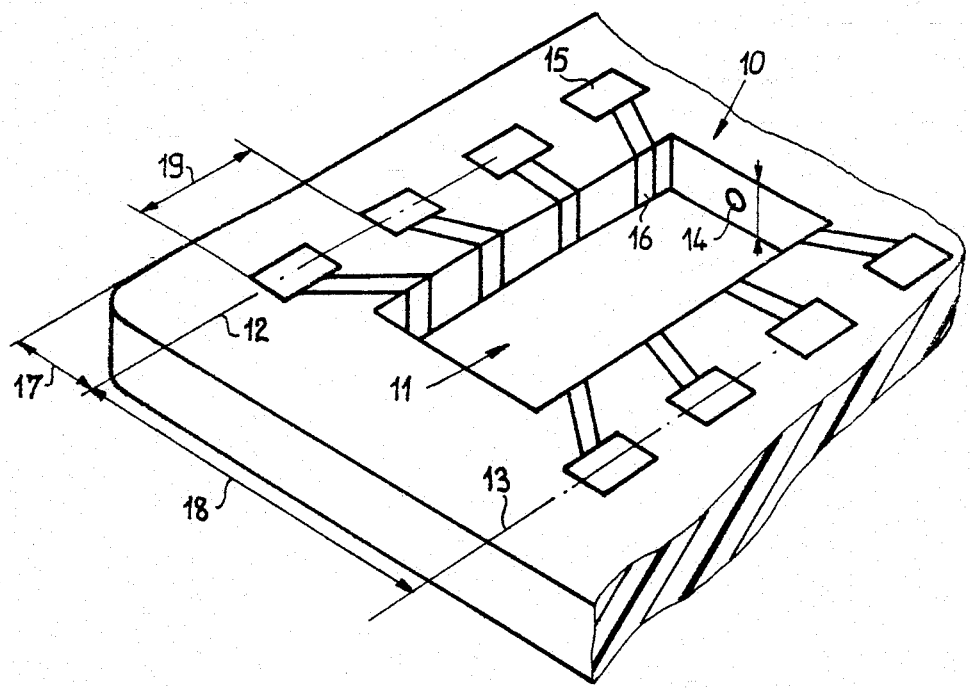

CARD CONTAINING A COMPONENT AND A MICROMODULE HAVING SIDE CONTACTS

BACKGROUND OF THE INVENTION

1. Field of the Invention

The present invention relates to a card containing a component and to a micromodule adapted to a card of this type. The invention finds an application in the fields of production and utilization of electronic control cards or electronic cash cards.

2. Description of the Prior Art

In the prior art, electronic payment or control cards already exist in a credit-card format. In known designs, electronic components of the memory-microcomputer type are mounted in cards of this type and serve to relieve terminals of part of the "intelligent" work. In the different professional fields, a distinction is made between manufacture of the card itself and manufacture of the component itself or association of both components considered together. The micromodule which contains a component integrated in a card is usually produced by an integrated circuit manufacturer. The production methods employed are derived directly from production lines for the manufacture of integrated semiconductor circuit packages.

The present invention proposes a novel micromodule and a novel card which is specially intended to permit the use of conventional integrated-circuit production lines for the manufacture of cards of this type. The invention offers a further advantage in that the integrated semiconductor circuit can readily be changed on the card. It is thus possible to recycle the cards at the end of a period of use.

SUMMARY OF THE INVENTION

The present invention is in fact concerned with a card containing a semiconductor component of the type in which contact pads are placed at predetermined points defined by a standard on a substrate having a credit-card format. The card is provided with at least one recess in one face which carries the contact pads, the sides of the recess being adapted to carry transfer contacts for establishing electric connections between the contact pads and the terminals of a micromodule which is plugged into the recess.

The invention is also concerned with a micro-module specially adapted to a CCC (chip carrying card) card in accordance with the invention.

BRIEF DESCRIPTION OF THE DRAWINGS

FIG. 1 is a sectional diagram of a micro-module in accordance with the invention.

FIG. 2 is a partial view of a CCC card in accordance with the invention.

DESCRIPTION OF THE PREFERRED EMBODIMENTS

FIG. 1 is a partial view of a micromodule adapted to the present invention, in which an integrated circuit 1 is fabricated from a semiconductor silicon chip. Connections formed by studs 2, 4 of filler metal are particularly well-suited to a continuous connection process. The semiconductor circuit is placed on a substrate 6 which will constitute part of a complete resin package 8. Metallic films in the form of beam leads such as those designated by the references 3 and 5 are placed automatically above the series of studs 2, 4. Each beam lead is soldered to a corresponding connection stud. The remainder of the package is then formed by encapsulation of the assembly. Finally, each beam lead 3, 5 is cut so as to be separated from the connecting tape. This method of establishing connections is known as the TAB (tape-automatic-bonding) process.

In accordance with the present invention, a side contact is made between the micromodule and the CCC card in which the micromodule is to be mounted. In order to establish a connection of this type, the invention proposes to bend each beam lead laterally in the downward direction against the sides of the chip carrier package. In the example of construction shown in FIG. 1, the completed bending operation is represented solely by the dashed line 7. In an alternative form of construction which constitutes another distinctive feature of the invention, the downwardly-bent beam leads 7 are guided and maintained by means 9 of recesses formed by molding in the chip carrier package. Thus the beam leads are intended to engage by snap action within said recesses in such a manner as to remain continuously in the desired position.

FIG. 2 illustrates a CCC card for receiving a micromodule in accordance with FIG. 1. The card 10 has a recess 11 in which the micromodule is intended to engage. Two rows of terminal connections or contact pads 12, 13 are located on each side of the recess 11. Each connection such as the pad 15 is positioned in accordance with a standard scheme of connections which is pre-established for cards of the CCC type. The connections on the card must necessarily comply with dimensions designated in the figure by the references 17-19. These dimensions are mainly the distance from center-line of one row 12 or 13 to one edge 17, the spacing of two rows 18 and the spacing or pitch 19 of two connections of one row. Since these dimensions do not correspond to standard dimensions of known connections as established by integrated semiconductor circuit standards, transfer connections are provided in order to adjust the side contacts of the micromodule to the contacts such as the contact pad 15 on the card. To this end, metallic strips are so arranged as to connect each contact pad such as the pad 15 to a side contact which is suitably arranged within the recess 11. These metallic strips can be obtained by different methods. In particular, strips of conductive metal can be adhesively bonded to the card surface. In another method of fabrication, the connections are made by hot-state pressing of conductive metal strips on the plastic card. In a further method of fabrication, the connections are deposited on the card by screen process. Finally, in yet another method of fabrication, the connections are deposited on the card by sputtering of metal in a vacuum.

After fabrication of the card, it is possible to deposit a semiconductor circuit in a micromodule such as the micromodule of FIG. 1 within the recess 11. The micromodule is installed within the recess and held in position therein by the elasticity of the side contacts such as the contact 7. In one embodiment which is illustrated by way of example in FIG. 2, snap-engagement means 14 are provided within the recess and adapted to cooperate with corresponding means on the micromodule or chip carrier package 8. In accordance with this distinctive feature, the snap-action engagement produced at the time of insertion of the micromodule in the card ensures permanent assembly during all normal handling operations performed by users.

The advantage offered by the present invention lies in the fact that it finds a practical application in production lines for the manufacture of standard integrated circuits. Another advantage is that the invention makes a distinction between on the one hand the particular problems of plug-in connection systems specifically in relation to the use of electronic cards and on the other hand the electronic problems presented by integrated circuits. By means of the invention, the integrated circuit which is the central core of the card can thus be made detachable. The card can therefore be reused several times for a number of different applications according to the micromodule which is employed.

What is claimed is:

1. A flat plastic card containing an integrated circuit, said card having a first and a second parallel main face and a cavity formed in said first face and containing a micromodule, said cavity having a bottom and lateral walls, said micromodule incorporating an integrated circuit chip and electrical connections for supplying electrical signals to and from said chip, a plurality of conductive pads on said first face, said conductive pads adapted for matching with contacts of a card reading apparatus when said card is removably inserted within such a reading apparatus, a plurality of conductive leads, each extending from one conductive pad on said first face and having a portion on a lateral wall of said cavity, said electrical connections of the micromodule each being in contact with said portion of a respective conductive lead when said micromodule is in place in the cavity.

2. A card according to claim 1, wherein the micromodule includes a semiconductor circuit in which electrical access terminals are connected to beam leads, and a molded package surrounding said circuit, the beam leads being bent downwards against the sides of said package.

3. A card according to claim 2, wherein the micromodule is provided with means for guiding and maintaining the downwardly-bent beam leads against the sides of the package.

4. A card according to claim 2, wherein the package is provided with snap-action means adapted to cooperate with corresponding snap-action means in the card recess for engagement of said package within said recess.

5. A card according to claim 1, wherein the contact pads are bonded metal strips.

6. A card according to claim 1, wherein the contact pads are hot-state-pressed metal strips.

7. A card according to claim 1, wherein the contact pads are screen deposited pads.

8. A card according to claim 1, wherein the contact pads are vacuum sputtered metal pads.

9. A card according to claim 1, wherein the micromodule has side contacts card.

* * * * *